(12) United States Patent
Braden et al.

(10) Patent No.: US 8,148,808 B2
(45) Date of Patent: Apr. 3, 2012

(54) PARTITIONING OF ELECTRONIC PACKAGES

(75) Inventors: Jeffrey S. Braden, Livermore, CA (US); Elizabeth A. Logan, Danville, CA (US)

(73) Assignee: LV Sensors, Inc., San Jose, CA (US)

( * ) Notice: Subject to any disclaimer, the term of this patent is extended or adjusted under 35 U.S.C. 154(b) by 480 days.

(21) Appl. No.: 12/156,673

(22) Filed: Jun. 2, 2008

(65) Prior Publication Data
US 2009/0045498 A1 Feb. 19, 2009

Related U.S. Application Data

(60) Provisional application No. 60/964,659, filed on Aug. 13, 2007.

(51) Int. Cl.
*H01L 23/24* (2006.01)

(52) U.S. Cl. ........... 257/687; 257/E23.14; 257/E29.347; 257/467; 257/723; 257/728; 257/685; 257/680; 257/773; 257/774

(58) Field of Classification Search ................... 257/687, 257/E23.14, 467, E29.347, 723, 728, 777, 257/685, 686, 680, 773, 774
See application file for complete search history.

(56) References Cited

U.S. PATENT DOCUMENTS

| | | | |
|---|---|---|---|
| 4,838,089 A | 6/1989 | Okada et al. | |
| 5,499,535 A * | 3/1996 | Amano et al. | 73/717 |
| 6,064,555 A * | 5/2000 | Czajkowski et al. | 361/111 |
| 6,401,545 B1 * | 6/2002 | Monk et al. | 73/756 |
| 6,407,545 B1 | 6/2002 | Sato et al. | |
| 6,534,711 B1 * | 3/2003 | Pollack | 174/529 |
| 6,927,482 B1 | 8/2005 | Kim et al. | |
| 7,187,067 B2 | 3/2007 | Weng et al. | |
| 7,410,829 B2 * | 8/2008 | Tokumitsu et al. | 438/109 |
| 7,615,835 B2 * | 11/2009 | Takemasa | 257/417 |
| 7,788,976 B2 * | 9/2010 | Shizuno | 73/493 |
| 2002/0162679 A1 | 11/2002 | Hannan et al. | |
| 2004/0118214 A1 | 6/2004 | McDonald et al. | |
| 2005/0101161 A1 * | 5/2005 | Weiblen et al. | 439/37 |
| 2005/0103105 A1 * | 5/2005 | Emmerich et al. | 73/493 |
| 2006/0163714 A1 | 7/2006 | Tsao et al. | |
| 2006/0255435 A1 | 11/2006 | Fuergut et al. | |
| 2007/0126130 A1 * | 6/2007 | Dehe et al. | 257/787 |
| 2007/0264743 A1 | 11/2007 | Vaganov et al. | |

(Continued)

OTHER PUBLICATIONS

Agustin, M., Anonuevo, D., Lynch, B., & Gibbs, G., "Achieving Optimal Dam-and-Fill Dispensing in a High-Mix BGA/CSP Environment", Jan.-Feb. 2002, pp. 1-6, ChipScale Review, http://chipscalereview.com/issues/0102/f3_01.html.

*Primary Examiner* — A O Williams
(74) *Attorney, Agent, or Firm* — Lumen Patent Firm

(57) ABSTRACT

Partitioning electronic sensor packages is provided. The electronic sensor package includes an electronic component, a sensor device, and electrical connections between the electronic component and the sensor device. A dam is written in the electronic sensor package to partition the package into two or more sections, where the sensor device is situated at least partially in one section and the electronic component is situated at least partially in another section. The partitioning of the dam allows the two sections to be filled with different fill materials. For example, the section with the sensor device can be filled with a soft gel-like material to provide some moisture protection to the sensor device without causing detrimental stresses to the sensor device, while the section with the electronic component can be filled with a highly moisture protective epoxy.

13 Claims, 6 Drawing Sheets

U.S. PATENT DOCUMENTS

| | | | |
|---|---|---|---|
| 2008/0130935 A1* | 6/2008 | Sato et al. | 381/361 |
| 2009/0065882 A1* | 3/2009 | Shirasaka | 257/415 |
| 2009/0145237 A1* | 6/2009 | Li et al. | 73/756 |
| 2009/0293618 A1* | 12/2009 | Tamura | 73/514.33 |
| 2009/0314095 A1* | 12/2009 | Lu | 73/727 |

* cited by examiner

PARTITIONING OF ELECTRONIC PACKAGES

CROSS-REFERENCE TO RELATED APPLICATIONS

This application claims priority from U.S. Provisional Patent Application 60/964,659 filed Aug. 13, 2007, which is incorporated herein by reference.

FIELD OF THE INVENTION

The invention relates generally to electronic packages. More particularly, the present invention relates to partitioning electronic sensor packages.

BACKGROUND

Packaging electronic devices provides protection to the internal components of the package from the external environment. However, the packaging of sensor devices, such as pressure sensors, presents the packaging engineer with many challenges. Because the sensor must have access to the external environment to perform its sensing function, the package must have an opening, exposing the internal components of the package to that external environment.

In conventional packaging, the integrated circuits are protected from the external environment by a molding or a coating, typically made from epoxy resin. This protective encapsulate ensures that the internal components of the package, including the devices and interconnections, are not exposed to the environment. The device is protected from the effects of moisture and contamination, which can lead to reliability concerns. In many electronic packages with a sensor device, however, epoxy cannot be placed directly onto the sensor device because of the stress induced by thermal expansion mismatches between the epoxy and the sensor device. Induced stresses may cause false readings by the sensor device.

Alternative protective coatings can be found in the form of gels, such as silicone and fluorosilicone. Some existing electronic sensor packages include gel coatings to reduce the thermal expansion mismatches. Gels provide a moisture barrier, preventing liquid water from contacting the surface of the device and, hence, from causing corrosion. Typically, these packages provide an opening in the gel coating over the top of a small portion of the sensing device. The opening enables the sensor device to have access to the external environment whilst retaining protection for the other internal electronic components. However, such gels are permeable to moisture vapor and do not provide the same level of protection for the remaining device as the molding or epoxy encapsulate.

Another existing approach for protecting electronic packages is to place a protective gasket around the sensor and then clamp the gasket within a housing. The gasket seals the sensor device from the rest of the housing, which can be filled with a protective material to encapsulate other electronic devices. Yet another approach is to mount two devices within a surface mount package. The main bulk of the electronics is then molded, whilst the sensor is left open in a cavity. The cavity can then be filled with a gel to provide some level of protection for the sensor.

However, problems exist with the gasket and molded approaches due to their requirement that the sensor device and other electronics must be placed sufficiently far apart from one another to allow for the positioning of the gasket or to allow for sufficient molding material to encase the electronics. This segregation of the internal components takes up valuable space within the package and places size constraints on the package. In addition, since the sensor device cannot be placed in close proximity to the electronics, there can exist problems with the sensor performance. For example, in the case of capacitive sensors, the capacitance of the interconnections between the sensor and the electronics can contribute to the sensor signal, giving inaccurate sensor readings.

Accordingly, there is a need in the art to develop new methods of partitioning electronic packages, particularly for packages with sensor devices.

SUMMARY OF THE INVENTION

The present invention is directed to partitioned electronic sensor packages. The electronic sensor package includes an electronic component, a sensor device, and one or more electrical connectors, such as wirebonds, flip chip connectors, TAB connectors, or any combination thereof, for connecting the electronic component and the sensor device. The sensor device, such as a pressure sensor, a temperature sensor, an acceleration sensor, a gyroscope, an optical sensor, a proximity sensor, a magnetic sensor, a current sensor, a stress sensor, a torque sensor, or any combination thereof, includes a working component for sensing a condition external to the sensor device. In a preferred embodiment, the electrical connectors are connected to the top of the sensor device and the working component of the sensor device is positioned on the bottom of the sensor device.

It is important to note that the electronic sensor package also includes a dam, where the dam is written to partition the package into at least two sections, a first section and a second section. The dam can be written across a surface of non-uniform heights and the top of the dam is approximately uniformly level. The sensor device is situated at least partially, and preferably exclusively, in the first section, while the electronic component is situated at least partially in the second section. The first section is at least partially filled with a first fill material and the second section is at least partially filled with a second fill material. In a preferred embodiment, the first fill material is different than the second fill material and the electrical connectors are situated exclusively within either the first section or the second section. Materials usable for the first fill material include a gel, a low stress elastomer, a fluid, a low modulus material, or any mixture thereof. Materials usable for the second fill material include an epoxy material, a silicone rubber material, an elastomer, a urethane material, a potting compound, a thermoset polymer, or any mixture thereof.

In a preferred embodiment, the electronic sensor package includes a premolded cavity package having opposing walls. An electronic component and a sensor device are positioned inside the premolded cavity package, and a dam is written from one of the walls of the premolded cavity package to another of the walls. In an alternative embodiment, the electronic sensor package includes a circuit board with an electronic component and a sensor device mounted on the circuit board. The electronic sensor package is partitioned into multiple sections by one or more dams written on the circuit board. One or more of the dams can define the perimeter of one of the sections on the circuit board.

The electronic sensor package of the present invention can also include a lid positioned on top of the first and second fill materials. In addition to or in replacement of the lid, a third fill material can be used. The third fill material can overflow the dam and be present in more than one section. The third fill material can be the same material as either the first or second fill material or the third fill material can be a different material than both the first and second fill materials. The electronic sensor package can also include additional electronic components, sensor devices, and/or electrical connectors.

The present invention is also directed at a method for packaging a sensor device. The method includes providing a container, such as a premolded cavity package, a circuit board, or any container usable for electronic packaging. The container includes at least an electronic component, such as an application specific integrated circuit, a sensor device, and one or more electrical connectors for connecting the electronic component and the sensor device. The method includes writing a dam to partition the container into at least a first section and a second section. The sensor device is situated at least partially, and preferably exclusively, in the first section and the electronic component is situated at least partially in the second section. The method further includes at least partially filling the first section with a first fill material and at least partially filling the second section with a second fill material, wherein the second fill material is different from the first fill material.

In an embodiment, the method also includes depositing a third fill material after at least partially filling the first and second sections. The third fill material can be the same material as either the first or second fill material or the third fill material can be a different material than both the first and second fill materials. In an alternative embodiment, the first section is filled to a level at or below the height of the dam and the second section is filled after the first section and the filling of the second section overflows the dam.

BRIEF DESCRIPTION OF THE FIGURES

The present invention together with its objectives and advantages will be understood by reading the following description in conjunction with the drawings, in which.

DETAILED DESCRIPTION OF THE INVENTION

Encapsulate materials, such as epoxy, can be used to protect components of conventional electronic packages. Electronic sensor devices are sensitive to package stresses, thus cannot be encapsulated or molded in the same manner as conventional integrated circuit devices. Gels can be used in place of epoxy; however, gels do not provide the same level of moisture protection as the epoxy. The present invention is directed to partitioning electronic sensor packages to allow appropriate fill materials to be used for different sections and/or components of the packages.

An electronic sensor package according to the present invention includes one or more dams written or drawn within the package to partition the package into any number of sections. A dam of the present invention can be written on a non-planar surface at any location within the package and can have any shape or size. The dam can be written on top of an electronic component and is not restricted to be placed between two electronic components. Each of the multiple sections partitioned by the dam can be left unfilled or filled with a specific fill material. The dam partitioned electronic package allows different forms of protective materials to be used within the same package and in multiple regions.

Figure 1A:
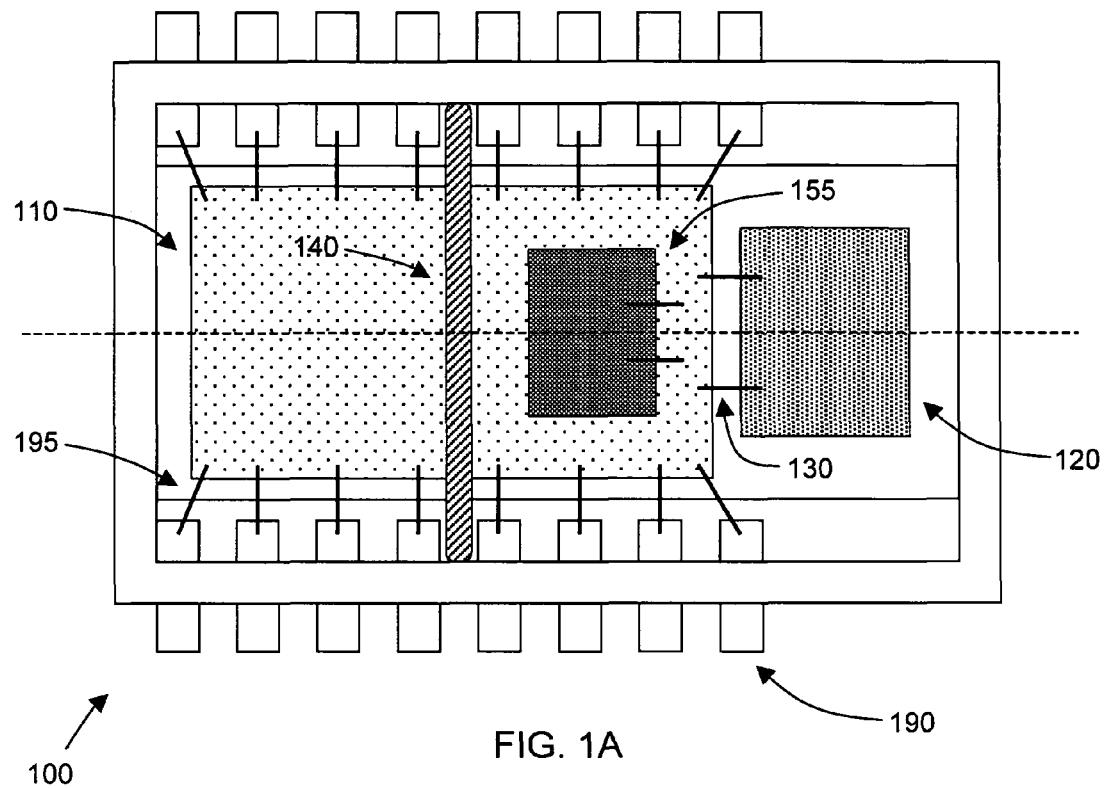
FIG. 1A shows a top view of an example partitioned electronic package according to the present invention.
Figure 1B:
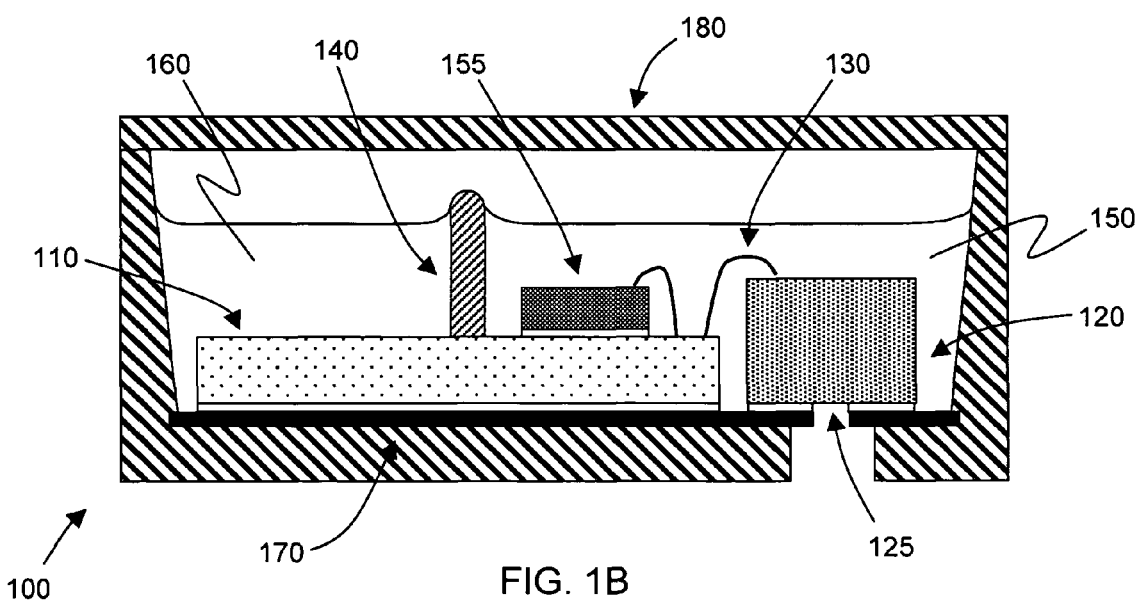
FIG. 1B shows a side cross-sectional view of an example partitioned electronic package according to the present invention.

FIGS. 1A and 1B show a top view and a side cross-sectional view, respectively, of an embodiment of an electronic sensor package 100 of the present invention. The electronic package 100 preferably includes a combination of an electronic component 110, such as an application specific integrated circuit (ASIC), and a sensor device 120 packed together in a pre-molded cavity package. Types of sensor devices 120 include, but are not limited to, pressure sensors, temperature sensors, and acceleration sensor, a gyroscope, an optical sensor, a proximity sensor, a magnetic sensor, a current sensor, a stress sensor, a torque sensor, or any combination thereof. The sensor device 120 can include a working component 125 for sensing a condition external to the sensor device 120, such as a membrane for a pressure sensor. The electronic component 110 and the sensor device 120 are electrically connected through one or more electrical connectors 130, such as a wirebond, a flip chip connector, or a TAB connector.

It is important to note that the electronic sensor package 100 includes one or more dams 140 to partition the package 100 into multiple sections. A dam 140 can be written over a surface of non-uniform heights or with structures of varying heights and levels. Preferably, the dam 140 is written to have an approximately uniform height across the length of the dam. Materials that can be used for the dam 140 include epoxy, silicone rubber and other thermoset or elastomeric materials of suitable viscosity. The electronic sensor package 100 is divided into at least two sections by the dam 140.

In a preferred embodiment, shown in FIG. 1A, the dam 140 is written on a container, such as a premolded cavity package, with a sensor device 120 and an electronic component 110. In particular, the dam 140 can be written from one wall of the premolded cavity package to an opposing wall of the package to partition the package into two sections. In other words, the perimeter of one or more of the sections comprises the walls of the premolded cavity package and the dam 140.

FIG. 1B shows a cross-section of the electronic package 100 along the dashed line in FIG. 1A. FIG. 1B shows the sensor device 120 situated entirely within the first section and the electronic component 110 situated partially in both sections. More generally, the sensor device 120 can be situated at least partially in one section and the electronic component 110 can be situated at least partially in another section. The sensor device 120 and the electronic component 110 can be placed on a leadframe plate 170.

The first section is filled with a first fill material 150 and the second section is filled with a second fill material 160. In a preferred embodiment, the first 150 and second 160 fill materials comprise different materials. Particularly, the fill material 150 of the first section, containing the sensor device 120, is a soft gel-like material to avoid the effects of packaging stress for the sensor 120 while providing some protection to the sensor 120. Materials usable for the first fill material 150 include, but are not limited to a gel, a low stress elastomer, a low modulus material, or any mixture thereof. Such materials generally have a modulus of 1 MPa or lower or a gel hardness value of less than bout 200. Typical examples of materials with appropriate properties can be found in the Dow Corning range of dielectric gels. The second section can be filled with a low viscosity protective encapsulate, such as an epoxy material, an epoxy resin, a silicone rubber material, an elastomer, a urethane material, a potting compound, a thermoset polymer, or a mixture thereof. The first and second sections can be filled to any heights. The electrical connectors 130 between the sensor device 120 and the electronic component 110 are preferably placed exclusively in the epoxy end of the package or exclusively in the gel-filled end of the package 100 to avoid stresses to the electrical connectors 130.

The electronic sensor package 100 can also include other components, such as a second sensor device 155, electrical leads 190, and any number of wires 195. Optionally, the electronic sensor package 100 can include a lid 180 to provide additional protection to the internal components of the package 100. Although the sensor device 120 and electronic component 110 are shown in the figures as separate devices, the present direction can be directed to a single device, in which the sensor and electronics are fabricated together.

Figure 2:
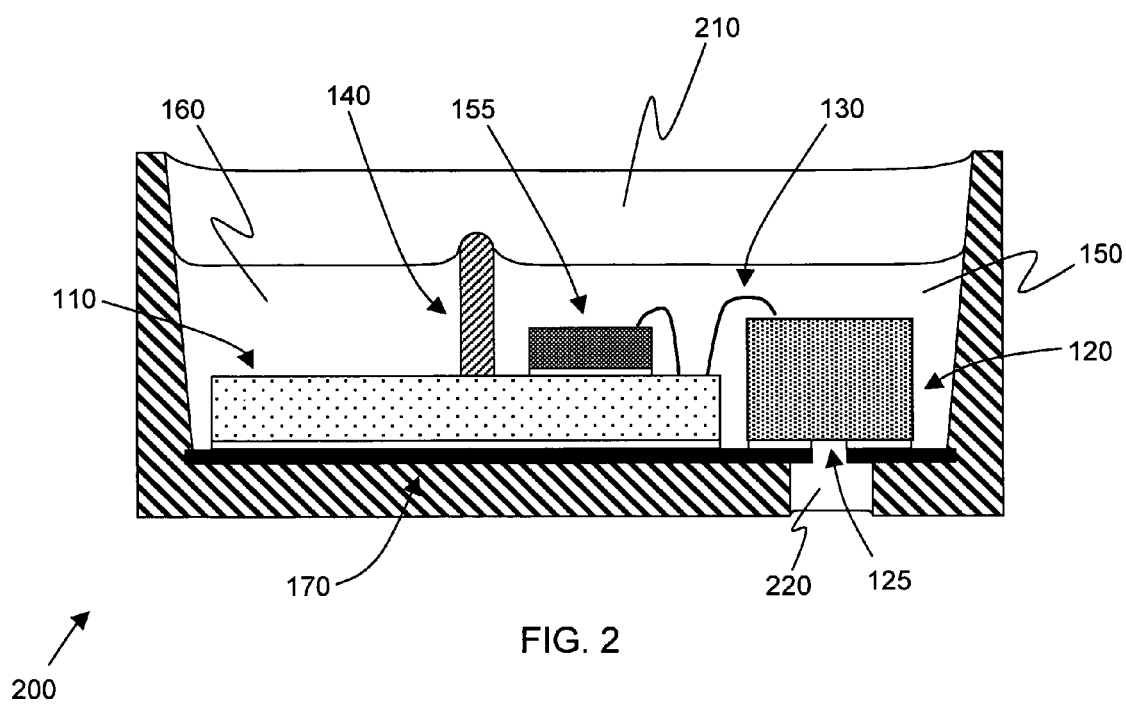
FIG. 2 shows a side cross-sectional view of an example partitioned electronic package having three fill materials according to the present invention.

FIG. 2 shows another embodiment of an electronic sensor package 200 having a third fill material 210. The third fill material 210 is deposited on top of the first 150 and second 160 fill materials. The third fill material 210 can be the same material as either the first 150 or the second 160 fill materials or can be a different material. In addition, the electronic sensor package 200 shown in FIG. 2 includes another optional fill material 220 for protection of the working component 125 of the sensor device 120. The fill material 220 is preferably a gel similar to the fill material 150 of the first section; however, any material which can transmit the sensed parameter from the environment to the working component can be used for the fill material 220. Such an optional fill material can be combined with any of the described embodiments. In the embodiments shown in FIG. 1B and FIG. 2, the working component 125 of the sensor device 120 is located on the bottom of the sensor device 120 and the electrical connectors 130 are connected to the top of the sensor device 120. Alternative configurations of the working component 125 and electrical connectors 130 can also be used.

Figure 3A:
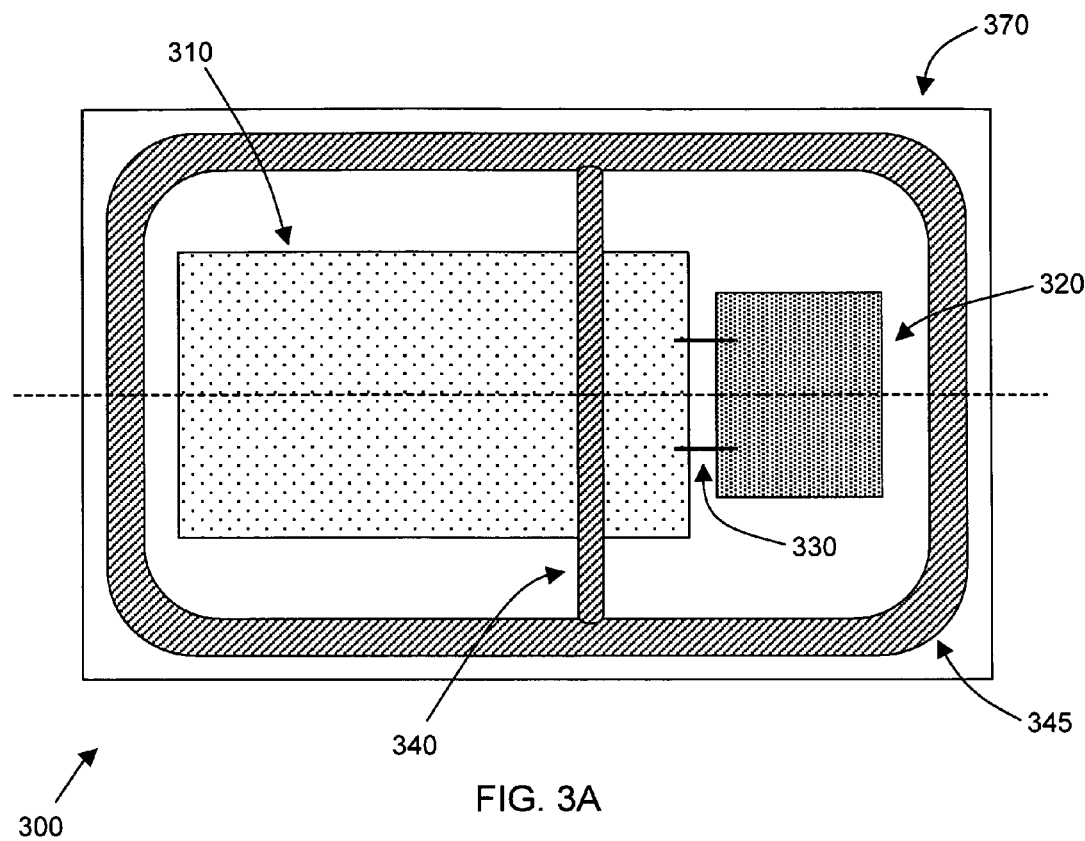
FIG. 3A shows a top view of an example partitioned electronic package with a dam written on a circuit board according to the present invention.
Figure 3B:
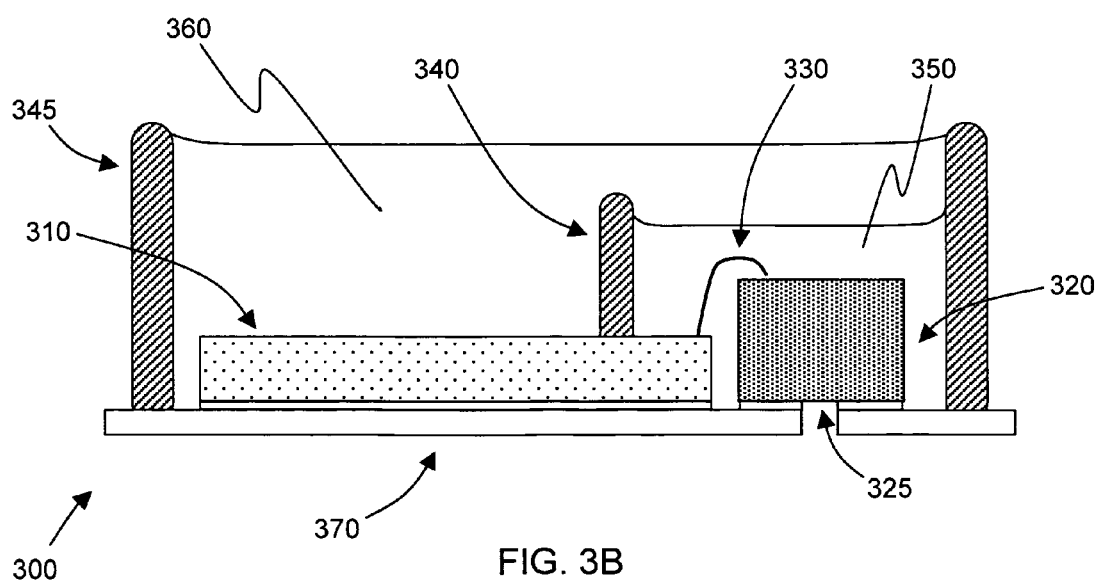
FIG. 3B shows a side cross-sectional view of the example partitioned electronic package of FIG. 3A according to the present invention.

It is important to note that the present invention, specifically the writing of the dam, is not limited to containers that are pre-molded cavity packages, but may be applied to containers of any package style, including ball grid array-(BGA) or chip scale package-(CSP) type laminate-based packages, chip on board packages, leadframe-based post molded packages, ceramic packages, and circuit boards. FIGS. 3A and 3B show top and side cross-sectional views, respectively, of an embodiment of an electronic package 300, in which the electronic component 310 and the sensor device 320 are mounted on a printed circuit board (PCB) 370.

In contrast to the embodiment shown in FIGS. 1A and 1B, the electronic sensor package 300 shown in FIGS. 3A and 3B have section perimeters defined solely by one or more dams 340 and 345. In other words, one or more dams 340 and 345 are written to form a closed section. Alternative embodiments can include any combination of section perimeter types, including section perimeters defined solely from one or more dams 340 and 345, section perimeters defined by structures of the package and one or more dams 140, and section perimeters defined without any dams.

FIG. 3B shows a cross-section of the electronic sensor package 300 along the dashed line shown in FIG. 3A. A dam 340 divides the first section, which includes the sensor device 320 and a second section, which partially includes an electronic component 310, such as an ASIC. Electrical connectors 330 connect the electronic component 310 and the sensor device 320. The first section is filled with a first fill material 350, such as a gel. The second section is filled with a second fill material 360 that overflows the dam 340, causing some of the second fill material 360 to be situated on top of the first fill material 350. Alternatively, the first and second sections can be filled in a similar manner as the electronic sensor package 100 shown in FIG. 1A.

Figure 4A:
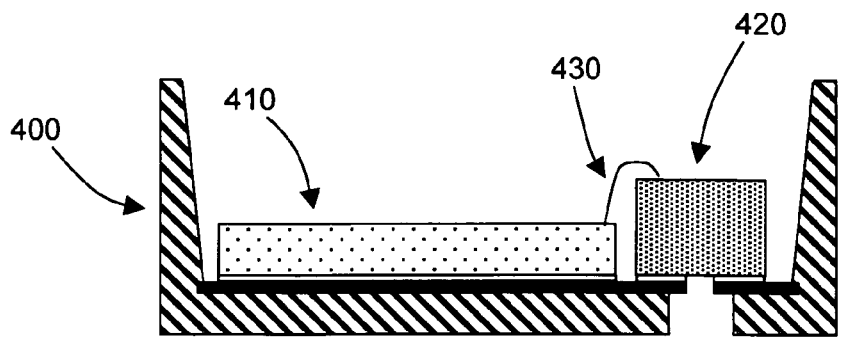
FIGS. 4A-D show the steps of partitioning an electronic package with a dam and filling the sections defined by the dam according to an embodiment of the present invention.
Figure 4B:
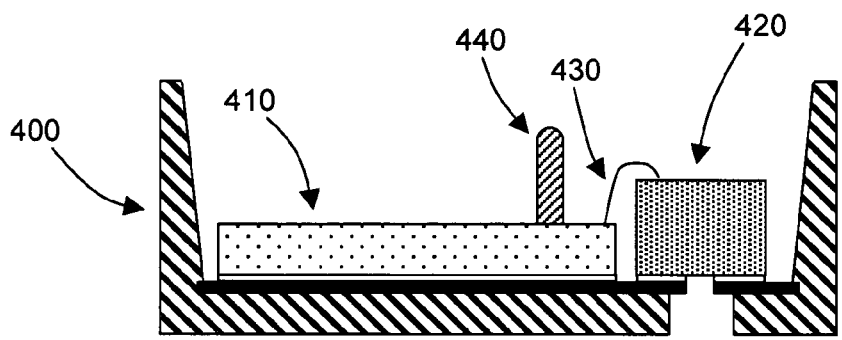
Figure 4C:
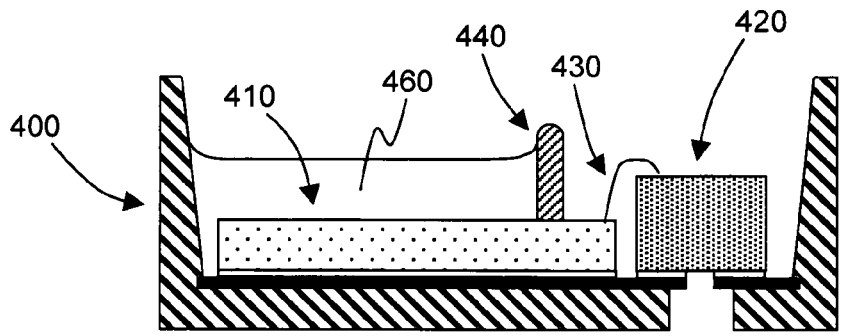
Figure 4D:
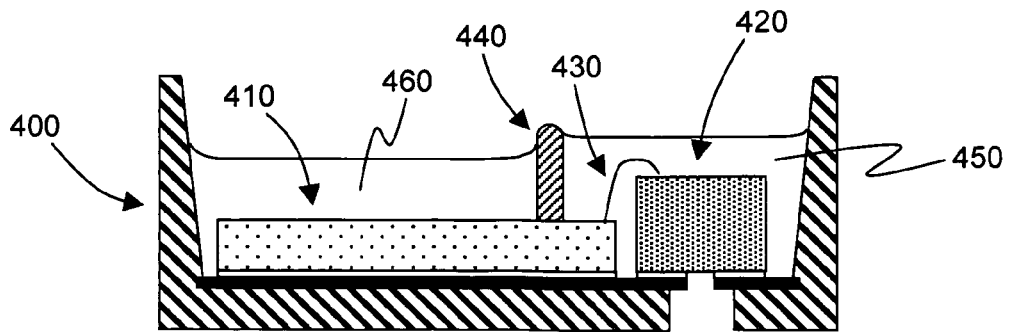
Figure 5A:
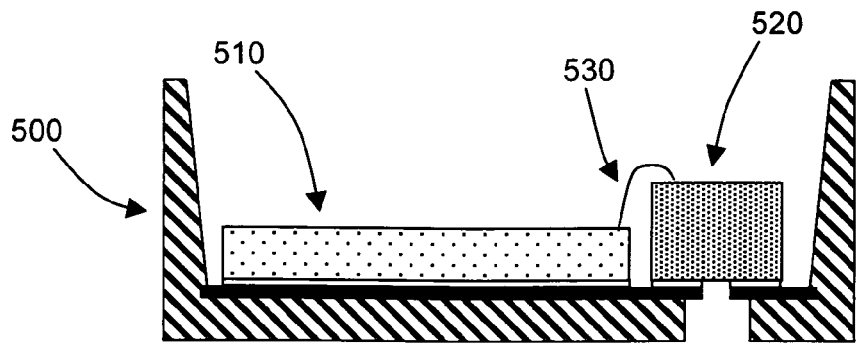
FIGS. 5A-D show the steps of partitioning an electronic package with a dam and filling the sections defined by the dam according to another embodiment of the present invention.
Figure 5B:
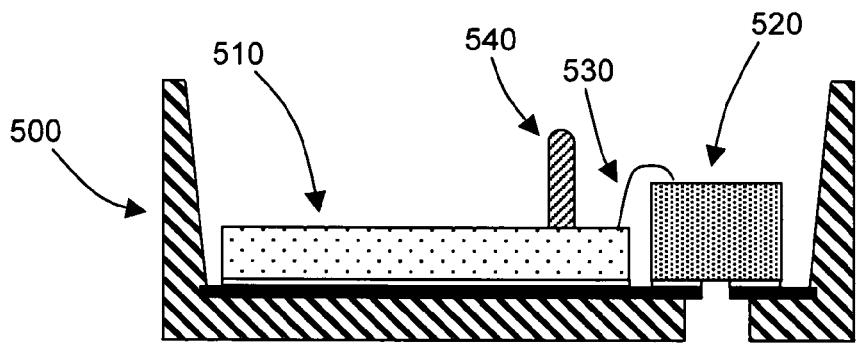
Figure 5C:
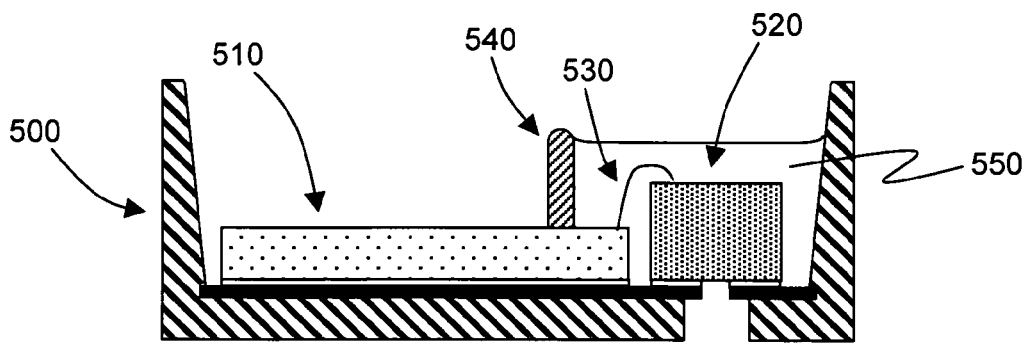
Figure 5D:
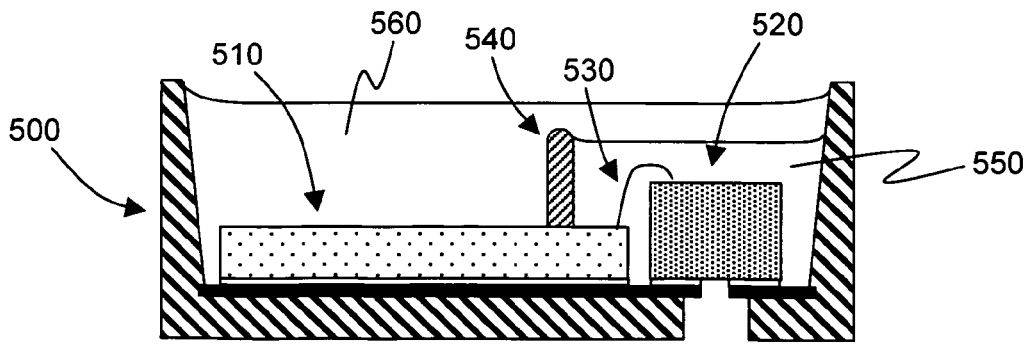

FIGS. 4A-D show different stages during the packaging and partitioning of an electronic sensor package 400 with an electronic component 410, a sensor device 420, and electrical connectors 430 between the sensor device 420 and the electronic component 410. An unpartitioned package 400 is shown in FIG. 4A. FIG. 4B shows a dam 440 written to divide the package 400 into multiple sections. FIG. 4C shows the second section filled with a second fill material 460 for providing protection to the electronic component 410. Next, FIG. 4D shows the filling of a first section, the section with the sensor device 420, with a first fill material 450. Though FIGS. 4C and 4D show the second section filled before the first section, alternative embodiments include filling the first section before filling the second section or filling both sections simultaneously. In addition, a third fill material can be deposited on top of the first fill material 450, the second fill material 460, or both fill materials.

FIGS. 5A-D show stages during the packaging and partitioning of an electronic sensor package 500 similar to FIGS. 4A-D. However, the alternative method of packaging shown in FIGS. 5A-D requires the first section having the sensor device 520 to be filled before the filling of the second section. After filling the first section to a level at or near the height of the dam 540 with a first fill material 550, the package 500 is filled with a second fill material 560 that overflows the dam; the second fill material 560 is deposited on the second section and on top of the first fill material 550.

Figure 6:
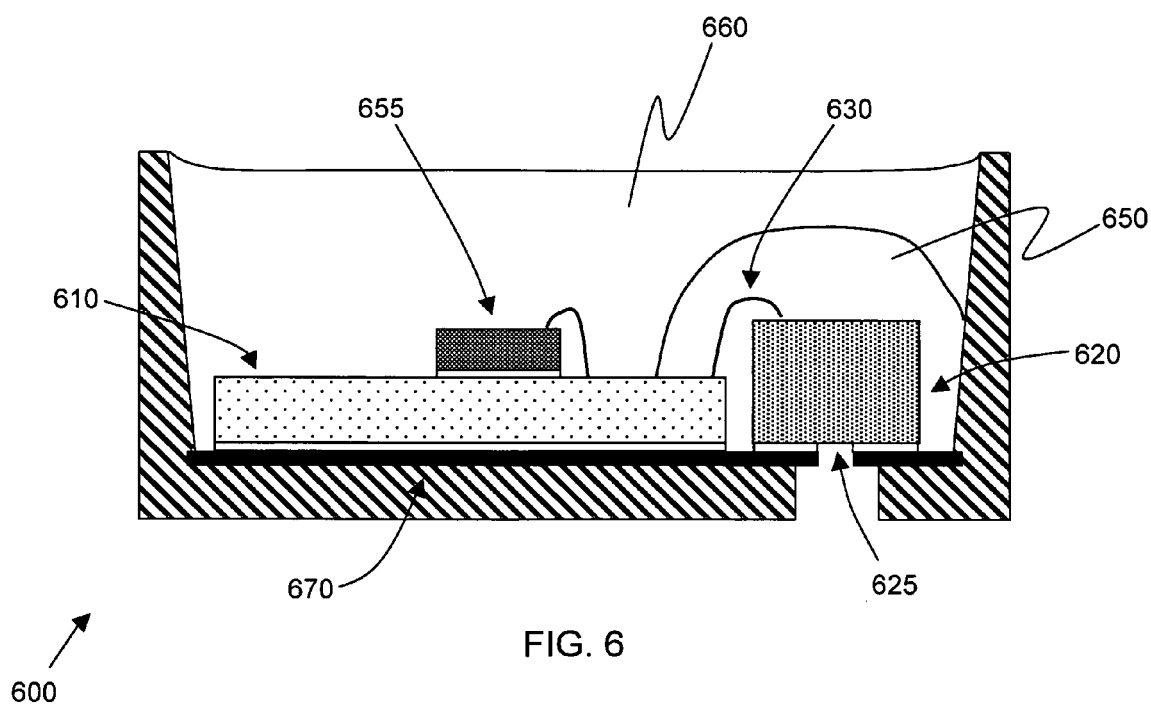
FIG. 6 shows a side cross-sectional view of an example electronic package having two different fills and no dam according to the present invention.

An additional embodiment of the electronic sensor package 600 is shown in FIG. 6. The package 600 does not include a dam. Instead, the sensor device 620 is at least partially covered by a first fill material 650 and a second fill material 660 is deposited to protect the remaining components of the package 600.

As one of ordinary skill in the art will appreciate, various changes, substitutions, and alterations could be made or otherwise implemented without departing from the principles of the present invention, e.g. any number of dams can be written on the electronic package and other types of sensor devices and electronic components can be included in addition to or in replacement of the devices and components explicitly disclosed. Accordingly, the scope of the invention should be determined by the following claims and their legal equivalents.

What is claimed is:

1. An electronic sensor package, comprising:
  (a) an electronic component;
  (b) a sensor device, wherein said sensor device comprises a working component for sensing a condition external to said sensor device;
  (c) one or more electrical connectors, wherein said one or more electrical connectors connect said electronic component and said sensor device; and (d) a dam, wherein said dam is written to partition said electronic sensor package into at least a first section and a second section, wherein said sensor device is situated at least partially in said first section, wherein said electronic component is situated at least partially in said second section, wherein said first section is at least partially filled with a first fill material, wherein said second section is at least partially filled with a second fill material, and wherein said first fill material is different from said second fill material;

wherein said electronic component and said sensor device are laterally separated from each other.

2. The electronic sensor package as set forth in claim 1, wherein said sensor device is situated exclusively in said first section.

3. The electronic sensor package as set forth in claim 1, wherein said sensor device has a top and a bottom, wherein said one or more electrical connectors are connected to said top of said sensor device, and wherein said working component is positioned on said bottom of said sensor device.

4. The electronic sensor package as set forth in claim 1, wherein said one or more electrical connectors is situated exclusively within either said first section or said second section.

5. The electronic sensor package as set forth in claim 1, wherein said one or more electrical connectors comprises a wirebond, a flip chip connector, a TAB connector or any combination thereof.

6. The electronic sensor package as set forth in claim 1, further comprising a premolded cavity package having opposing walls, wherein said electronic component and said sensor device are positioned inside said premolded cavity package, and wherein said dam is written from one of said walls to another of said walls of said premolded cavity package.

7. The electronic sensor package as set forth in claim 1, further comprising a circuit board, wherein said electronic component and said sensor device are mounted onto said circuit board, and wherein a perimeter of at least one of said sections is defined by said dam.

8. The electronic sensor package as set forth in claim 1, wherein said dam is written across a surface of non-uniform heights, and wherein the top of said dam is approximately uniformly level.

9. The electronic sensor package as set forth in claim 1, further comprising a lid, wherein said lid is positioned on top of said first and said second fill materials.

10. The electronic sensor package as set forth in claim 1, further comprising a third fill material, wherein said third fill material overflows said dam.

11. The electronic sensor package as set forth in claim 1, wherein said first fill material comprises a gel, a low stress elastomer, a fluid, a low modulus material, or any mixture thereof.

12. The electronic sensor package as set forth in claim 1, wherein said second fill material comprises an epoxy material, a silicone rubber material, an elastomer, a urethane material, a potting compound, a thermoset polymer, or any mixture thereof.

13. The electronic sensor package as set forth in claim 1, wherein said sensor device comprises a pressure sensor, a temperature sensor, an acceleration sensor, a gyroscope, an optical sensor, a proximity sensor, a magnetic sensor, a current sensor, a stress sensor, a torque sensor, or any combination thereof.

* * * * *